US011393992B2

(12) United States Patent
Feng

(10) Patent No.: US 11,393,992 B2
(45) Date of Patent: Jul. 19, 2022

(54) ORGANIC LIGHT EMITTING DIODE DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Zikang Feng, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 145 days.

(21) Appl. No.: 16/621,787

(22) PCT Filed: May 17, 2019

(86) PCT No.: PCT/CN2019/087389
§ 371 (c)(1),
(2) Date: Dec. 12, 2019

(87) PCT Pub. No.: WO2020/224000
PCT Pub. Date: Nov. 12, 2020

(65) Prior Publication Data
US 2021/0328160 A1    Oct. 21, 2021

(30) Foreign Application Priority Data
May 6, 2019 (CN) .......................... 201910372118.X

(51) Int. Cl.
*H01L 51/00* (2006.01)
*H01L 51/52* (2006.01)

(52) U.S. Cl.
CPC ...... *H01L 51/0097* (2013.01); *H01L 51/5237* (2013.01); *H01L 2251/5338* (2013.01)

(58) Field of Classification Search
None
See application file for complete search history.

(56) References Cited

U.S. PATENT DOCUMENTS

| 2016/0100478 | A1* | 4/2016 | Lee ........................ G06F 1/1626 361/749 |
| 2016/0216737 | A1* | 7/2016 | Hayk .................... G06F 1/1626 |
| 2016/0320804 | A1* | 11/2016 | Takayanagi ........... G06F 1/1615 |
| 2016/0366772 | A1* | 12/2016 | Choi ..................... G06F 1/1652 |
| 2018/0014417 | A1* | 1/2018 | Seo ....................... H05K 1/0203 |

(Continued)

FOREIGN PATENT DOCUMENTS

| CN | 104933964 A | 9/2015 |
| CN | 106603756 A | 4/2017 |

(Continued)

*Primary Examiner* — Michelle Mandala
*Assistant Examiner* — Jordan M Klein

(57) ABSTRACT

The present disclosure provides an organic light emitting diode (OLED) display device, including a support member, a central frame disposed on the display support member. A left frame slidably connected to the central frame. A right frame slidably connected to the central frame. The OLED display is rolled up or stretched by sliding the left frame and the right frame. Therefore, space of large display is reduced, and convenience of carrying is enhanced.

19 Claims, 4 Drawing Sheets

(56) References Cited

U.S. PATENT DOCUMENTS

| | | | | |
|---|---|---|---|---|
| 2018/0077808 A1* | 3/2018 | Seo | ................... | H05K 5/0217 |
| 2018/0102072 A1* | 4/2018 | Lee | ................... | G09G 3/20 |
| 2018/0103550 A1* | 4/2018 | Seo | ................... | H01F 7/0205 |

FOREIGN PATENT DOCUMENTS

| | | |
|---|---|---|
| CN | 107731098 A | 2/2018 |
| CN | 107818735 A | 3/2018 |

* cited by examiner

ORGANIC LIGHT EMITTING DIODE DISPLAY DEVICE

FIELD OF INVENTION

The present disclosure relates to the field of display technology, in particular to organic light emitting diode display device.

BACKGROUND OF INVENTION

Organic light emitting diode displays have attracted wide attention due to their flexible properties. Organic light-emitting diode displays can reduce display size by folding or rolling up. However, there is still a lack of display devices that can reduce their size by rolling the organic light emitting diode display.

Therefore, it is necessary to provide an organic light emitting diode display device to solve the issues of the prior art.

Organic light-emitting diode display can reduce the display size by folding or rolling up. However, there is still a lack of display devices of reducing their size by rolling the organic light emitting diode display.

SUMMARY OF INVENTION

To solve the technical problem described above, the present disclosure provides an organic light emitting diode display device. It can reduce space of large display, and enhance convenience of carrying.

To achieve the propose descript above, the present disclosure provides an organic light emitting diode (OLED) display device, including a support member; a central frame disposed on the support member; a left frame located at a left side of the support member and slidably connected to the central frame, an upper portion of the left frame comprising a left sawtooth structure having a sawtooth shape; a right frame located at a right side of the display support member and slidably connected to the central frame, an upper portion of the right frame including a right sawtooth structure having a sawtooth shape; a display support member, wherein a left side of the display support member is connected to the left frame, and a right side of the display support member is connected to the right frame; and an OLED display, attached to an upper portion of the display support member; wherein when the left frame or the right frame slides away from the central frame, the left sawtooth structure and the right sawtooth structure supports an expanded part of the display support member; when the left frame or the right frame slides to the central frame, a left side of the display support member and a left side of the OLED display, or a right side of the display support member and a right side of the OLED display are rolled into an interior of the left frame or an interior of the right frame.

In an embodiment of the present disclosure, an edge of the left frame including a left opening penetrating the left frame.

In an embodiment of the present disclosure, an edge of the right frame including a right opening penetrating the right frame.

In an embodiment of the present disclosure, the interior of the left frame further includes a left rolled spring, the left rolled spring is connected to the left side of the display support member, when the left frame slides toward the central frame, a part of the display support member and a part of the OLED display are rolled into the interior of the left frame.

In an embodiment of the present disclosure, the interior of the right frame further includes a right rolled spring, the right rolled spring is connected to the right side of the display support member, when the right frame slides toward the central frame, a part of the display support member and a part of the OLED display are rolled into the interior of the right frame.

In an embodiment of the present disclosure, the central frame further includes a left slider, the left frame further includes a left sliding rail, the left frame slides relative to the central frame through the left slider and the left sliding rail.

In an embodiment of the present disclosure, a track direction of the left sliding rail is declined from a top right of the left frame to a bottom left of the left frame.

In an embodiment of the present disclosure, a height difference between a highest point of the left sliding rail and a lowest point of the left sliding rail is the same as a height difference between a top surface of the central frame and a top surface of the left sawtooth structure.

In an embodiment of the present disclosure, a horizontal length of the left sliding rail is the same as a length of the top surface of the central frame.

In an embodiment of the present disclosure, the central frame further comprises a right slider, the right frame further comprises a right sliding rail, the right frame slides relative to the central frame through the right slider and the right sliding rail.

In an embodiment of the present disclosure, a track direction of the right sliding rail is declined from a top left of the right frame to a bottom right of the right frame.

In an embodiment of the present disclosure, a height difference between a highest point of the right sliding rail and a lowest point of the right sliding rail is the same as a height difference between a top surface of the central frame and a top surface of the right sawtooth structure.

In an embodiment of the present disclosure, a horizontal length of the right sliding rail is the same as a length of the top surface of the central frame.

In an embodiment of the present disclosure, the central frame further includes a plurality of guide rails, the support member further incudes a plurality of guide columns, the central frame slides up and down relative to the support member through the guide rails and the guide columns.

In an embodiment of the present disclosure, when the left sawtooth structure is tightly engaged with the right sawtooth structure, each of the guide rails clads each of the guide columns.

In an embodiment of the present disclosure, the display support member is a metal sheet.

In an embodiment of the present disclosure, a bottom of the left frame and a bottom of the right frame each comprises a slider chute structure configured to restrict the left frame and the right frame from sliding in a left-right direction relative to the central frame.

The present disclosure further providing an organic light emitting diode display device including a support member; a central frame disposed on the support member; a left frame located at a left side of the support member and slidably connected to the central frame, an upper portion of the left frame including a left sawtooth structure having a sawtooth shape, an interior of the left frame further comprises a left rolled spring, an edge of the left frame including a left opening penetrating the left frame, the left rolled spring is connected to the left side of the display support member; a right frame located at a right side of the support member and slidably connected to the central frame, an upper portion of the right frame including a right sawtooth structure having a sawtooth shape, an interior of the right frame further comprises a right rolled spring, an edge of the right frame including a right opening penetrating the right frame, the right rolled spring is connected to the right side of the display support member; and a display support member, wherein a left side of the display support member is connected to the left frame, and a right side of the display support member is connected to the right frame; and an OLED display attached to an upper portion of the display support member; wherein the left frame, the right frame and the central frame are linkage arrangement, when the left frame or the right frame slides away from the central frame, the left sawtooth structure and the right sawtooth structure supports an expanded part of the display support member; when the left frame or the right frame slides toward the central frame, a left side of the display support member and a left side of the OLED display, or a right side of the display support member and a right side of the OLED display are rolled into an interior of the left frame or an interior of the right frame.

The present disclosure further providing an organic light emitting diode display device including an organic light emitting diode (OLED) display device including a support member disposed a plurality of guide columns; a central frame disposed on the support member, the central frame further comprised a plurality of guide rails, the central frame slides up and down relative to the support member through the guide rails and the guide columns; a left frame located at a left side of the support member and slidably connected to the central frame, an upper portion of the left frame including a left sawtooth having a sawtooth shape; a right frame located at a right side of the support member and slidably connected to the central frame, an upper portion of the right frame including a right sawtooth structure having a sawtooth shape; a display support member, wherein a left side of the display support member is connected to the left frame, and a right side of the display support member is connected to the right frame; and an OLED display attached to an upper portion of the display support member; wherein a bottom of the left frame and a bottom of the right frame each comprises a slider chute structure configured to restrict the left frame and the right frame from sliding in a left-right direction relative to the central frame, when the left frame or the right frame slides away from the central frame, the left sawtooth structure and the right sawtooth structure supports an expanded part of the display support member; when the left frame or the right frame slides toward the central frame, a left side of the display support member and a left side of the OLED display, or a right side of the display support member and a right side of the OLED display are rolled into an interior of the left frame or an interior of the right frame.

Compared to the prior art, the present disclosure provides an OLED display device, including a support member, a central frame disposed on the support member, a left frame located at a left side of the support member and slidably connected to the central frame, an upper portion of the left frame including a left sawtooth structure having a sawtooth shape. A right frame located at a right side of the support member and slidably connected to the central frame, an upper portion of the right frame including a right sawtooth structure having a sawtooth shape. An OLED display attached to an upper portion of the display support member. Wherein when the left frame or the right frame slides away from the central frame, the left sawtooth structure and the right sawtooth structure supports an expanded part of the display support member; when the left frame or the right frame slides toward the central frame, a left side of the display support member and a left side of the OLED display, or a right side of the display support member and a right side of the OLED display are rolled into an interior of the left frame or an interior of the right frame. The OLED display is rolled up or stretched by sliding the left frame and the right frame. Therefore, space of large display is reduced, and convenience of carrying is enhanced.

DETAILED DESCRIPTION OF PREFERRED EMBODIMENTS

The following description of the various embodiments is provided to clearly and completely describe the technical solutions in the embodiments of the present disclosure with the accompanying drawings. Obviously, the described embodiments are only a part of the embodiments of the present disclosure. Based on the embodiments of the present disclosure, those embodiments which make from the skilled in the art without any inventive efforts are within the scope of the present disclosure.

In the figures, structurally similar elements are noted with the same reference numbers.

Figure 1:
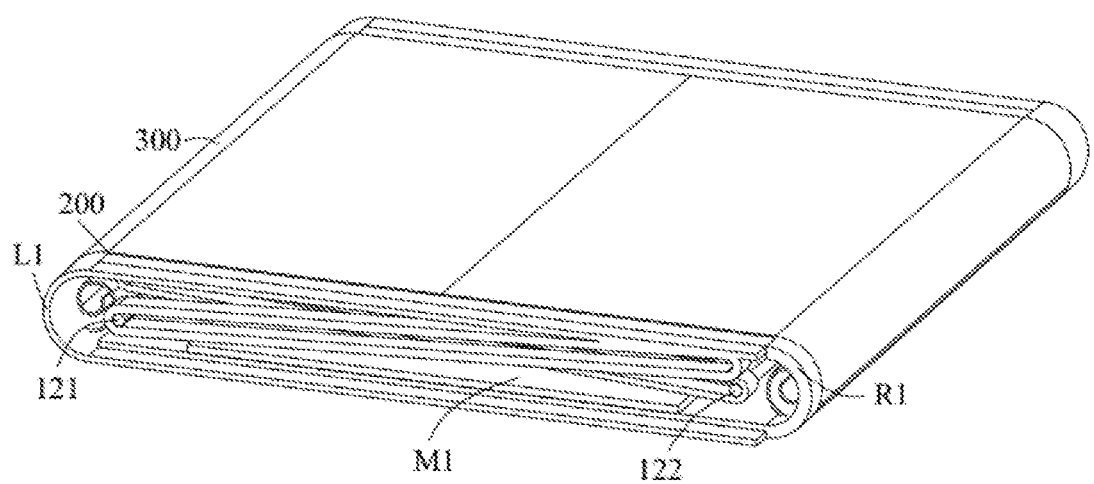
FIG. 1 is a top structural schematic diagram showing an organic light emitting diode display device in a first state according to an embodiment of the present disclosure.
Figure 2:
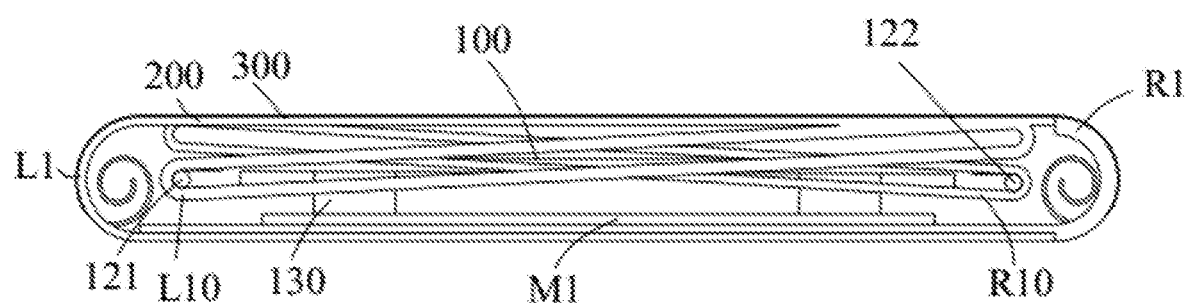
FIG. 2 is a side structural schematic diagram showing an organic light emitting diode display device in a first state according to an embodiment of the present disclosure.
Figure 3:
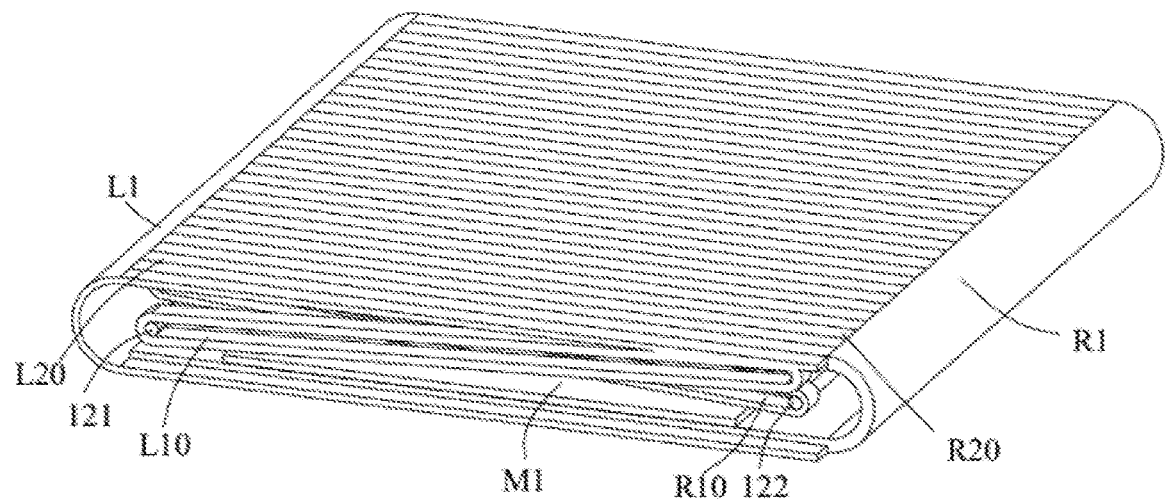
FIG. 3 is a top structural schematic diagram showing an organic light emitting diode display device without disposing the organic light emitting diode display in a first state according to an embodiment of the present disclosure.

Please refer to FIG. 1, FIG. 2 and FIG. 3., which are structural schematic diagram showing an organic light emitting diode display device in a first state according to an embodiment of the present disclosure. As shown in figure, the organic light emitting diode display device includes a support member M1, a central frame 100 disposed on the support member M1. A left frame L1 located at a left side of the support member M1, and slidably connected to the central frame 100. An upper portion of the left frame L1 including a left sawtooth structure L20 having a sawtooth shape. A right frame R1 located at a right side of the support member M1, and slidably connected to the central frame 100. An upper portion of the right frame R1 including a right sawtooth structure R20 having a sawtooth shape. A display support member 200, a left side of the display support member 200 is connected to the left frame L1, and a right side of the display support member 200 is connected to the right frame R1. An OLED display 300 attached to an upper portion of the display support member 200. Wherein when the left frame L1 or the right frame R1 slides away from the central frame 100, the left sawtooth structure L20 and the right sawtooth structure R20 supports an expanded part of the display support member 200.

In an embodiment of the present embodiment, the left frame L1 or the right frame R1 slides toward the central frame 100. A left side of the display support member 200 and a left side of the OLED display 300, or a right side of the display support member 200 and a right side of the OLED display 300, are rolled into an interior of the left frame L1 or an interior of the right frame R1.

In an embodiment of the present embodiment, when the left frame L1 slides toward the central frame 100, a left side of the display support member 200 and a left side of the OLED display 300 are rolled into an interior of the left frame L1.

In an embodiment of the present embodiment, when the left frame L1 slides toward the central frame 100, a right side of the display support member 200 and a right side of the OLED display 300 are rolled into an interior of the right frame R1.

In an embodiment of the present embodiment, when the right frame R1 slides toward the central frame 100, a right side of the display support member 200 and a right side of the OLED display 300 are rolled into an interior of the right frame R1.

In an embodiment of the present embodiment, when the right frame R1 slides toward the central frame 100, a left side of the display support member 200 and a left side of the OLED display 300 are rolled into an interior of the left frame L1.

In an embodiment of the present embodiment, an edge of the left frame L1 including a left opening penetrating the left frame L1. Wherein, the left side of the display support member 200 and the left side of the organic light emitting diode display 300 are passing through the left opening into the left frame L1.

In an embodiment of the present embodiment, an edge of the right frame R1 including a right opening penetrating the right frame R1. Wherein, the right side of the display support member 200 and the right side of the organic light emitting diode display 300 are passing through the right opening into the right frame R1.

In an embodiment of the present embodiment, the interior of the left frame L1 further includes a left rolled spring, the left rolled spring is connected to the left side of the display support member 200. When the left frame slides toward the central frame, a part of the display support member and a part of the OLED display are rolled into the interior of the left frame. More specifically, when the left frame L1 slides toward the central frame 100, a part of the display support member 200 rolled into the interior of the left frame L1, and the display support member 200 drive a part of the OLED display 300 rolled into the interior of the left frame.

In an embodiment of the present embodiment, the interior of the right frame R1 further includes a right rolled spring, the right rolled spring is connected to the right side of the display support member 200, when the right frame R1 slides toward the central frame 100, a part of the display support member 200 and a part of the OLED display 300 are rolled into the interior of the right frame R1. More specifically, when the right frame R1 slides toward the central frame 100, a part of the display support member 200 rolled into the interior of the right frame R1, and the display support member 200 drive a part of the OLED display 300 rolled into the interior of the right frame R1.

In an embodiment of the present embodiment, the central frame 100 further includes a left slider 121, the left frame L1 further includes a left sliding rail L10, the left frame L1 slides relative to the central frame 100 through the left slider 121 and the left sliding rail L10. A track direction of the left sliding rail L10 is declined from a top right of the left frame L1 to a bottom left of the left frame L1.

In an embodiment of the present embodiment, the central frame 100 further includes a right slider 122, the right frame R1 further includes a right sliding rail R10, the right frame R1 slides relative to the central frame 100 through the right slider 122 and the right sliding rail R10. A track direction of the right sliding rail R10 is declined from a top left of the right frame R1 to a bottom right of the right frame R1.

In an embodiment of the present embodiment, the central frame 100 further includes a plurality of guide rails 130, the support member M1 further includes a plurality of guide columns M10, the central frame 100 slides up and down relative to the support member M1 through the guide rails 130 and the guide columns M10.

Figure 4:
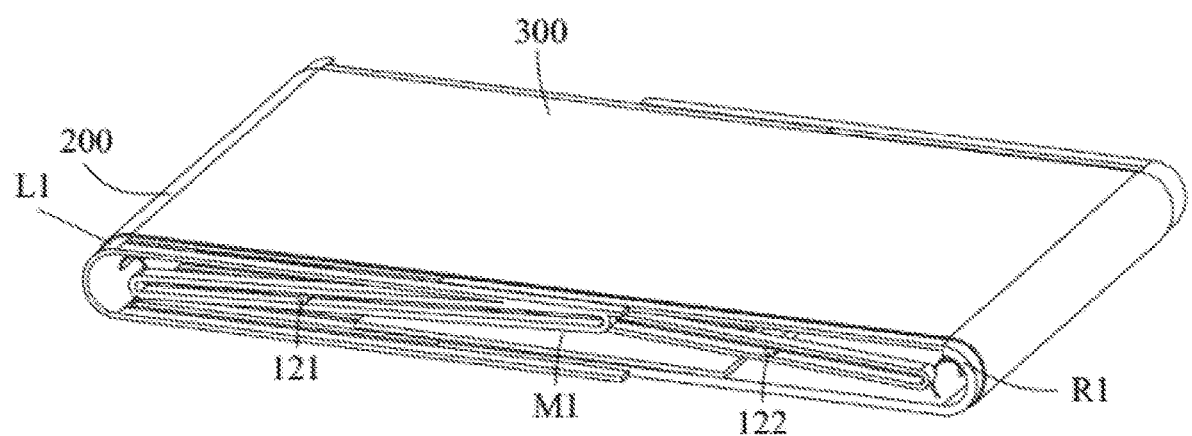
FIG. 4 is a top structural schematic diagram showing an organic light emitting diode display device in a second state according to an embodiment of the present disclosure.
Figure 5:
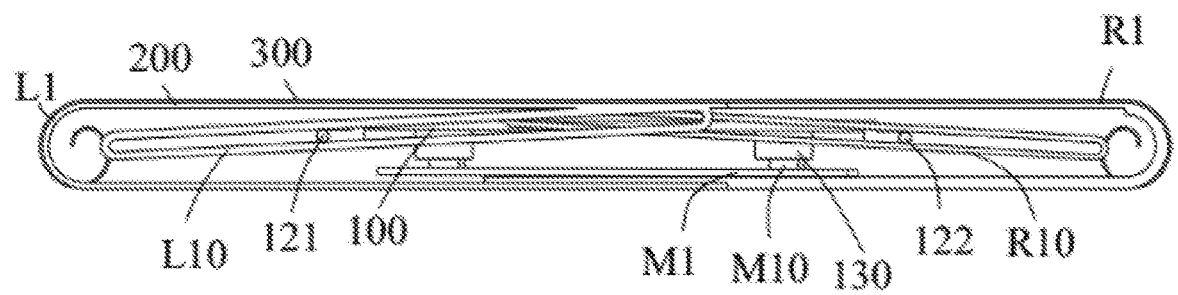
FIG. 5 is a side structural schematic diagram showing an organic light emitting diode display device in a second state according to an embodiment of the present disclosure.
Figure 6:
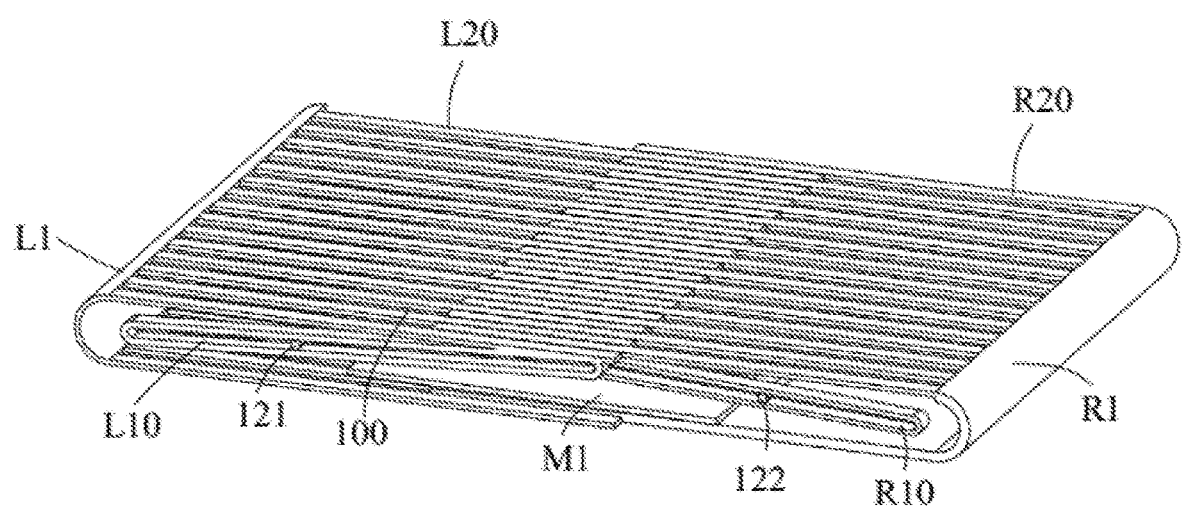
FIG. 6 is a top structural schematic diagram showing an organic light emitting diode display device is not provided with the organic light emitting diode display in a second state according to an embodiment of the present disclosure.

Please refer to FIG. 4, FIG. 5 and FIG. 6., which are structural schematic diagram showing an organic light emitting diode display device in a second state according to an embodiment of the present disclosure. Wherein, compared with the first state, in the second state, the left frame L1 and the right frame R1 slide to the left side and right side respectively, to drive the display support member 200 and the organic light emitting diode display 300 to extend outward. A plane supporting the display support 200 is formed by a left sawtooth structure L20 disposed on an upper portion of the left frame L1 and a right sawtooth structure L20 disposed on an upper portion of the right frame R1. The track direction of the right sliding rail R10 is declined from the top left of the right frame R1 to the bottom right of the right frame R1. During the process of sliding the right frame R1 toward right side, the right sliding rail R10 drives the right slider 122 to gradually rise upward. The track direction of the left sliding rail L10 is declined from a top right of the left frame L1 to a bottom left of the left frame L1. During the process of sliding the left frame L1 toward left side, the left sliding rail L10 drives the left slider 121 to gradually rise upward.

In an embodiment of the present embodiment, by increasing the number of the sawtooth shapes of the left sawtooth structure L20 and the right sawtooth structure R20, especially when the left sawtooth structure L20 and the right sawtooth structure R20 are slides away from the central frame 100, gaps between the sawtooth shapes of the left sawtooth structure L20 and the right sawtooth structure R20 are reduced. In other words, the flatness of the OLED display device in the stretched state can be enhanced by increasing the number of the sawtooth shapes of the left sawtooth structure L20 and the right sawtooth structure R20. In an embodiment of the present disclosure, the number of the sawtooth shapes of the left sawtooth structure L20 and the right sawtooth structure R20 is respectively 30 or more.

Figure 7:
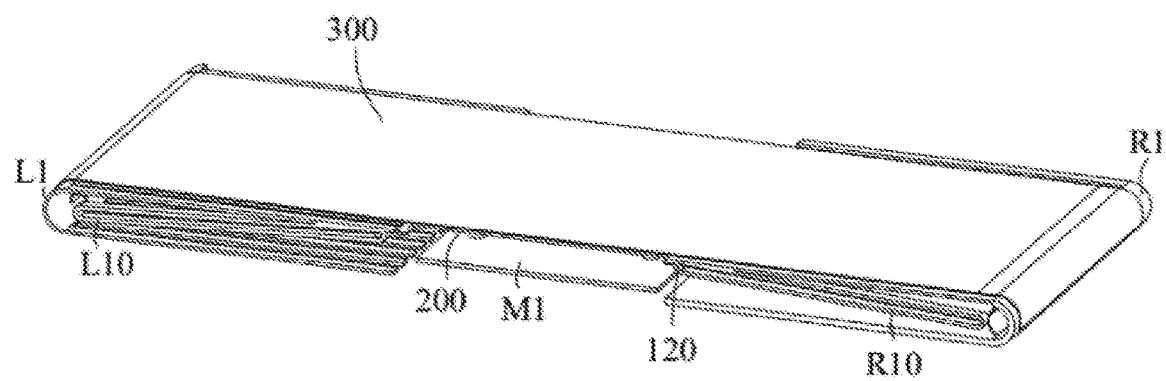
FIG. 7 is a top structural schematic diagram showing an organic light emitting diode display device in a third state according to an embodiment of the present disclosure.
Figure 8:
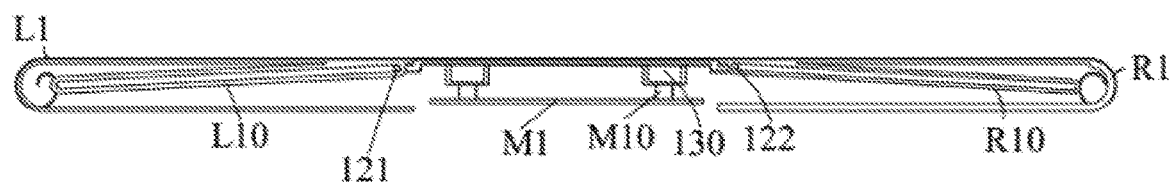
FIG. 8 is a side structural schematic diagram showing an organic light emitting diode display device in a third state according to an embodiment of the present disclosure.
Figure 9:
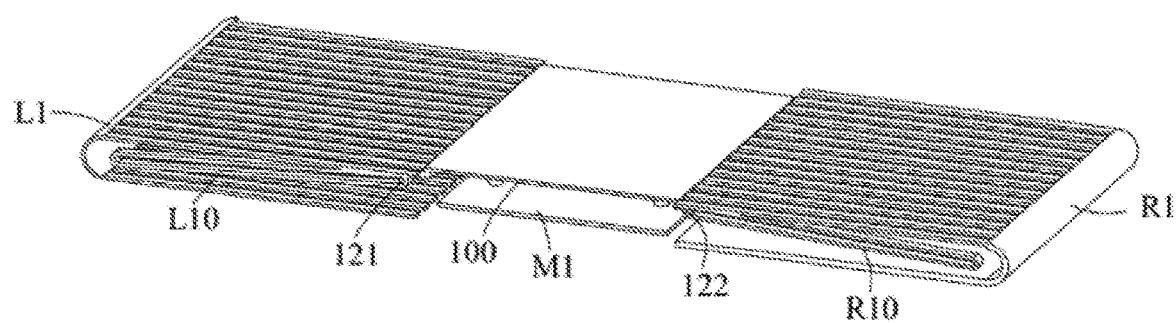
FIG. 9 is a top structural schematic diagram showing an organic light emitting diode display device is not provided with the organic light emitting diode display in a first state according to an embodiment of the present disclosure.

Please refer to FIG. 7, FIG. 8 and FIG. 9., which are structural schematic diagram showing an organic light emitting diode display device in a third state according to an embodiment of the present disclosure. Wherein, compared with the first state and the second state, in the third state, the left frame L1 and the right frame R1 slide to the sides respectively. The left slider 121 abuts an end of the left sliding rail L10, the right slider 122 abuts an end of the right sliding rail R10. In the third state, by disposing the right sliding rail R10 which declined from the top left of the right frame L1 to the bottom right of the right frame R1, the right sliding rail R10 drives the right slider 122 upward to an extreme position abuts the end of the right sliding rail R10. By disposing the left sliding rail L10 declined from the top left of the left frame L1 to the bottom right of the right frame L1, the left sliding rail L10 drives the left slider 121 upward to an extreme position abuts the end of the left sliding rail L10. In the third state, the center frame 100 is raised to be flush with the left frame L10 and the right frame R10 to form a plane, to support the intermediate portion of the display support member 200.

In an embodiment of the present disclosure, a bottom of the left frame L1 and a bottom of the right frame R1 each includes a slider chute structure configured to restrict the left frame L1 and the right frame R1 from sliding in a left-right direction relative to the central frame 100.

In an embodiment of the present disclosure, a bottom of the left frame L1 and a bottom of the right frame R1 each includes a slider structure, a left side adjacent to the left frame L1 of the central frame 100 and a right side adjacent to the left frame R1 of the central frame 100 each includes a chute structure which corresponding to the slider structure.

In an embodiment of the present disclosure, a bottom of the left frame L1 and a bottom of the right frame R1 each disposed mutually staggered slider chute structures configured to restrict the left frame L1 and the right frame R1 from sliding in a left-right direction relative to the central frame 100.

However, the stretched states of the OLED display device provided by the present disclosure is not limited to three display states descripted above. With the OLED display device provided by the present disclosure, the user can adjust a position of the left frame L1 and a position of the right frame R1 to adjust the stretched states of the display support member 200 and the OLED display 300, to achieve the effect of adjusting the size of the display device and the exposed display screen.

In an embodiment of the present disclosure, a height difference between a highest point and a lowest point of the left sliding rail L10 is the same as a height difference between a top surface of the central frame 100 and a top surface of the left sawtooth structure L20, a top surface of the right sawtooth structure R20. To ensure that when the left frame L1 and the right frame R1 are fully stretched, the top surface of the central frame 100 rises to be flush with the top surface of the left sawtooth structure L20 and the top surface of the right sawtooth structure R20.

In an embodiment of the present disclosure, a horizontal length of the left sliding rail L10 is the same as a length of the top surface of the central frame 100. A horizontal length of the right sliding rail R10 is the same as a length of the top surface of the central frame 100. To ensure that when the left frame L1 and the right frame R1 are fully stretched, the display support member 200 and the OLED display 300 are stretched to about 3 times larger than the first state.

Wherein, in an embodiment of the present disclosure, a horizontal length of the left sliding rail L10 is not the same as a length of the top surface of the central frame 100. A horizontal length of the right sliding rail R10 is not the same as a length of the top surface of the central frame 100. By disposing the left sliding rail L10 having the horizontal length different with the length of the top surface of the central frame 100 and/or the right sliding rail R10 having the horizontal length different with the length of the top surface of the central frame 100, changing a size of display support member 200 and a size of the OLED display 300 when the left frame L1 and the right frame R1 are fully stretched. In an embodiment of the present disclosure, the horizontal length of the left sliding rail L10 is the same as half of the length of the top surface of the central frame 100, the horizontal length of the right sliding rail R10 is the same as the length of the top surface of the central frame 100, therefore, the display support member 200 and the OLED display 300 are stretched to about 1.5 times larger than the first state. In an embodiment of the present disclosure, the horizontal length of the right sliding rail R10 is the same as half of the length of the top surface of the central frame 100, the horizontal length of the left sliding rail L10 is the same as the length of the top surface of the central frame 100, the display support member 200 and the OLED display 300 are stretched to about 1.5 times larger than the first state.

In an embodiment of the present disclosure, the horizontal length of the right sliding rail R10 is not the same as the horizontal length of the left sliding rail L10.

Please further refer to FIG. 2 and FIG. 5, as shown in FIG. 2, when the left sawtooth structure L20 is tightly engaged with the right sawtooth structure R20 in the first state, each of the guide rails 130 clads each of the guide columns M10. As shown in FIG. 5, in the second state, each of the guide rails 130 covers but not clads each of the guide columns M10. However, in an embodiment of the present disclosure, when the left sawtooth structure L20 is tightly engaged with the right sawtooth structure R20 in the first state, each of the guide rails 130 covers but not clads each of the guide columns M10.

In an embodiment of the present disclosure, the display support member 200 is a metal sheet. By disposing the display support member 200 to enhance the flatness of the surface of support the OLED display device. In specifically, when the left frame L1 or the right frame R1 slides away from the central frame 100, even the left sawtooth structure L20 is not tightly engaged with the right sawtooth structure R20, the display support member 200 can still significantly reduce the unevenness of the touch OLED display 300. In addition, by disposing the OLED display 300 on the display support member 200 can also prevent the organic light emitting diode display 300 from being pulled directly.

In summary, the present disclosure provides an OLED display device, including a support member, a central frame disposed on the support member, a left frame located at a left side of support member and slidably connected to the central frame, an upper portion of the left frame including a left sawtooth structure having a sawtooth shape. A right frame located at a right side of the support member and slidably connected to the central frame, an upper portion of the right frame including a right sawtooth structure having a sawtooth shape. An OLED display attached to an upper portion of the display support member. Wherein when the left frame or the right frame slides away from the central frame, the left sawtooth structure and the right sawtooth structure supports an expanded part of the display support member; when the left frame or the right frame slides toward the central frame, a left side of the display support member and a left side of the OLED display, or a right side of the display support member and a right side of the OLED display are rolled into an interior of the left frame or an interior of the right frame. The OLED display is rolled up or stretched by sliding the left frame and the right frame. Therefore, space of large display is reduced, and convenience of carrying is enhanced.

The technical scope of the present disclosure is not limited only to the contents of the above description. Those skilled in the art can make different modifications and changes to the above-described embodiments without departing from the spirit and scope of the disclosure, and such different modifications and changes are within the scope of the present disclosure.

What is claimed is:

1. An organic light emitting diode (OLED) display device, comprising:
   a support member;
   a central frame disposed on the support member;
   a left frame located at a left side of the support member and slidably connected to the central frame, an upper portion of the left frame comprising a left sawtooth structure having a sawtooth shape;
   a right frame located at a right side of the support member and slidably connected to the central frame, an upper portion of the right frame comprising a right sawtooth structure having a sawtooth shape;
   a display support member, wherein a left side of the display support member is connected to the left frame, and a right side of the display support member is connected to the right frame; and
   an OLED display attached to an upper portion of the display support member;
   wherein when the left frame or the right frame slides away from the central frame, the left sawtooth structure and the right sawtooth structure supports an expanded part of the display support member; when the left frame or the right frame slides toward the central frame, a left side of the display support member and a left side of the OLED display, or a right side of the display support member and a right side of the OLED display are rolled into an interior of the left frame or an interior of the right frame; and
   wherein the central frame further comprises a plurality of guide rails, the support member further comprises a plurality of guide columns, and the central frame slides up and down relative to the support member through the guide rails and the guide columns.

2. The OLED display device according to claim 1, wherein an edge of the left frame comprises a left opening penetrating the left frame.

3. The OLED display device according to claim 1, wherein an edge of the right frame comprises a right opening penetrating the right frame.

4. The OLED display device according to claim 1, wherein the interior of the left frame further comprises a left rolled spring, the left rolled spring is connected to the left side of the display support member, when the left frame slides toward the central frame, a part of the display support member and a part of the OLED display are rolled into the interior of the left frame.

5. The OLED display device according to claim 1, wherein the interior of the right frame further comprises a right rolled spring, the right rolled spring is connected to the right side of the display support member, when the right frame slides toward the central frame, a part of the display support member and a part of the OLED display are rolled into the interior of the right frame.

6. The OLED display device according to claim 1, wherein the central frame further comprises a left slider, the left frame further comprises a left sliding rail, the left frame slides relative to the central frame through the left slider and the left sliding rail.

7. The OLED display device according to claim 6, wherein a track direction of the left sliding rail declines from a top right of the left frame to a bottom left of the left frame.

8. The OLED display device according to claim 6, wherein a height difference between a highest point of the left sliding rail and a lowest point of the left sliding rail is same as a height difference between a top surface of the central frame and a top surface of the left sawtooth structure.

9. The OLED display device according to claim 6, wherein a horizontal length of the left sliding rail is same as a length of the top surface of the central frame.

10. The OLED display device according to claim 1, wherein the central frame further comprises a right slider, the right frame further comprises a right sliding rail, the right frame slides relative to the central frame through the right slider and the right sliding rail.

11. The OLED display device according to claim 10, wherein a track direction of the right sliding rail declines from a top left of the right frame to a bottom right of the right frame.

12. The OLED display device according to claim 10, wherein a height difference between a highest point of the right sliding rail and a lowest point of the right sliding rail is same as a height difference between a top surface of the central frame and a top surface of the right sawtooth structure.

13. The OLED display device according to claim 10, wherein a horizontal length of the right sliding rail is same as a length of the top surface of the central frame.

14. The OLED display device according to claim 1, wherein when the left sawtooth structure is tightly engaged with the right sawtooth structure, each of the guide rails dads each of the guide columns.

15. The OLED display device according to claim 1, wherein the display support member is a metal sheet.

16. The OLED display device according to claim 1, wherein a bottom of the left frame and a bottom of the right frame each comprises a slider chute structure configured to restrict the left frame and the right frame from sliding in a left-right direction relative to the central frame.

17. An organic light emitting diode (OLED) display device comprising:
   a support member;
   a central frame disposed on the support member;
   a left frame located at a left side of the support member and slidably connected to the central frame, an upper portion of the left frame comprising a left sawtooth structure having a sawtooth shape, an interior of the left frame further comprises a left rolled spring, an edge of the left frame comprising a left opening penetrating the left frame, the left rolled spring is connected to the left side of a display support member;
   a right frame located at a right side of the support member and slidably connected to the central frame, an upper portion of the right frame comprising a right sawtooth structure having a sawtooth shape, an interior of the right frame further comprises a right rolled spring, an edge of the right frame comprising a right opening penetrating the right frame, the right rolled spring is connected to the right side of the display support member; and
   the display support member, wherein a left side of the display support member is connected to the left frame, and a right side of the display support member is connected to the right frame; and
   an OLED display attached to an upper portion of the display support member;

wherein the left frame, the right frame and the central frame are linkage arrangement, when the left frame or the right frame slides away from the central frame, the left sawtooth structure and the right sawtooth structure supports an expanded part of the display support member; when the left frame or the right frame slides toward the central frame, a left side of the display support member and a left side of the OLED display, or a right side of the display support member and a right side of the OLED display are rolled into an interior of the left frame or an interior of the right frame; and wherein the central frame further comprises a plurality of guide rails, the support member further comprises a plurality of guide columns, and the central frame slides up and down relative to the support member through the guide rails and the guide columns.

18. An organic light emitting diode (OLED) display device comprising:
a support member disposed a plurality of guide columns;
a central frame disposed on the support member, the central frame further comprised a plurality of guide rails, the central frame slides up and down relative to the support member through the guide rails and the guide columns;
a left frame located at a left side of the support member and slidably connected to the central frame, an upper portion of the left frame comprising a left sawtooth structure having a sawtooth shape;
a right frame located at a right side of the support member and slidably connected to the central frame, an upper portion of the right frame comprising a right sawtooth structure having a sawtooth shape;
a display support member, wherein a left side of the display support member is connected to the left frame, and a right side of the display support member is connected to the right frame; and
an OLED display attached to an upper portion of the display support member;
wherein a bottom of the left frame and a bottom of the right frame each comprises a slider chute structure configured to restrict the left frame and the right frame from sliding in a left-right direction relative to the central frame, when the left frame or the right frame slides away from the central frame, the left sawtooth structure and the right sawtooth structure supports an expanded part of the display support member; when the left frame or the right frame slides toward the central frame, a left side of the display support member and a left side of the OLED display, or a right side of the display support member and a right side of the OLED display are rolled into an interior of the left frame or an interior of the right frame.

19. The OLED display device according to claim 18, when the left sawtooth structure is tightly engaged with the right sawtooth structure, each of the guide rails dads each of the guide columns.

* * * * *